United States Patent [19]

Hayes et al.

[11] Patent Number: 4,740,247

[45] Date of Patent: Apr. 26, 1988

[54] METHOD FOR PRINTED CIRCUIT BOARD AND/OR PRINTED WIRING BOARD SOLDERMASK TESTING

[75] Inventors: Michael E. Hayes; Craig C. Hood; Ronald E. Miller; Robert Sharpe, all of Fernandina Beach, Fla.

[73] Assignee: Petroleum Fermentations N.V., Curacao, Netherlands Antilles

[21] Appl. No.: 877,930

[22] Filed: Jun. 24, 1986

Related U.S. Application Data

[62] Division of Ser. No. 750,198, Jul. 1, 1985, Pat. No. 4,640,719.

[51] Int. Cl.$^4$ ............ B08B 7/00; B08B 7/04; B08B 30/00
[52] U.S. Cl. ............ 134/42; 134/18; 134/26; 134/30; 134/40; 427/8; 73/150 R; 374/53
[58] Field of Search ............ 134/18, 26, 30, 40, 134/42; 427/8; 73/150 R; 374/53

[56] References Cited

U.S. PATENT DOCUMENTS

| | | | |
|---|---|---|---|
| 3,650,669 | 3/1972 | Osborn et al. | 427/37 X |
| 3,715,293 | 2/1973 | Sandre et al. | 427/44 X |
| 3,933,674 | 1/1976 | Farnsworth | 252/171 |
| 3,989,610 | 11/1976 | Tsukada et al. | 427/54.1 X |
| 4,064,287 | 12/1977 | Lisson et al. | 427/53.1 X |
| 4,246,147 | 1/1981 | Bakos et al. | 260/18 EP |
| 4,276,186 | 6/1981 | Bakos et al. | 134/40 X |
| 4,297,729 | 10/1981 | Bakos et al. | 252/545 |
| 4,369,287 | 1/1983 | Hutchinson et al. | 524/700 |
| 4,373,974 | 2/1983 | Barajas | 148/24 |
| 4,434,084 | 2/1984 | Hicks et al. | 252/512 |
| 4,461,652 | 7/1984 | Richmond | 134/2 |
| 4,511,488 | 4/1985 | Matta | 252/162 |
| 4,569,695 | 2/1986 | Yamashita et al. | 134/30 X |
| 4,589,926 | 5/1986 | Holmstrand | 134/30 X |
| 4,620,937 | 11/1986 | Dellutri | 134/40 X |

FOREIGN PATENT DOCUMENTS 3316988 11/1984 Fed. Rep. of Germany.

*Primary Examiner*—Helen M. S. Sneed
*Assistant Examiner*—William G. Wright
*Attorney, Agent, or Firm*—Pennie & Edmonds

[57] ABSTRACT

Methods and compositions are provided for the removal of rosin soldering flux and adhesive tape residues from printed circuit and/or wiring boards, and for testing the quality of curing of U.V.-cured soldermask on such boards. The compositions of the invention contain terpene compounds, preferably in combination with terpene emulsifying surfactants to facilitate removal by rinsing in water.

9 Claims, No Drawings

METHOD FOR PRINTED CIRCUIT BOARD AND/OR PRINTED WIRING BOARD SOLDERMASK TESTING

This application is a division of application Ser. No. 750,198 filed July 1, 1985 now U.S. Pat. No. 4,640,719.

FIELD OF THE INVENTION

The present invention relates to non-toxic, environmentally safe compositions for use in cleaning during the fabrication of printed circuit or printed wiring boards. Terpene compounds are utilized with or without terpene emulsifying surfactants to achieve a variety of objectives, among which are the removal of solder flux, oils, waxes and greasy substances or adhesive tape residues. The compositions of the invention may also be used to test the quality of curing of ultraviolet soldermask.

BACKGROUND OF THE INVENTION

In the fabrication of printed wiring boards and/or printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes, which are generally non-corrosive and have a much longer history of use, are still widely used throughout the electronics industry. The water soluble fluxes, which are a more recent development, are being used increasingly in consumer products applications. Because they contain strong acids and/or amine hydrohalides and are thus corrosive, the water soluble soldering fluxes can cause circuit failure if residual traces of the material are not carefully removed. For that reason military specifications require the use of rosin fluxes.

Even the use of rosin soldering fluxes, however, can lead to premature circuit failure due to decreased board resistance if traces of residual flux are not removed following soldering. While water soluble fluxes can be easily removed with warm, soapy water, the removal of rosin flux from printed wiring boards has traditionally been carried out with the use of chlorinated hydrocarbon solvents such as 1,1,1,-trichlorethane, trichloromonofluoromethane, methylene chloride, trichlorotrifluoroethane, or mixtures or azeotropes of these solvents. These solvents are undesirable, however, because they are toxic. Thus, their use is subject to close scrutiny by the Occupational Safety and Health Administration (OSHA), and stringent containment equipment must be used. Moreover, if released into the environment these solvents are not readily biodegradable and are thus hazardous for long periods of time.

Alkaline cleaning compounds known as the alkanol amines, usually in the form of monoethanolamine, have been used for rosin flux removal as an alternative to the toxic chlorinated hydrocarbon solvents. These compounds chemically react with rosin flux to form a rosin soap through the process of saponification. Other organic substances such as surfactants or alcohol derivatives may be added to these alkaline cleaning compounds to facilitate the removal of such rosin soap. Unfortunately, these compounds like the water soluble soldering fluxes have a tendency to cause corrosion on the surfaces and interfaces of printed wiring boards if they are not completely and rapidly removed during the fabrication process.

In another approach, Bakos et al. [U.S. Pat. No. 4,276,186] have used mixtures of N-methyl-2-pyrrolidone and a water miscible alkanolamine to remove solder flux and solder flux residue from integrated circuit modules. These mixtures were also said to be useful for removing various cured synthetic organic polymer compositions such as cured polyimide coating compositions from integrated circuit chip modules.

During the manufacture of printed wiring boards, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. A residue of the tape adhesive generally remains which, if not throughly removed, can cause premature board failure. Removal of this tape residue has traditionally been carried out by the use of chlorinated solvents which, as already described, are toxic and environmentally undesirable.

A further procedure that is commonly carried out during printed circuit board fabrication is the application of a soldermask. As the name implies, a soldermask is a polymer or resin coating that is selectively applied to a printed circuit board to shield areas where solder is not required or desired. Where such masking is to be permanent, the soldermask must be "cured," a process by which monomeric reactants are made to polymerize. If curing of the soldermask is incomplete, solder will penetrate areas that are to be shielded, resulting in destruction of the board.

One kind of soldermask is based on acrylate chemistry and is photo-initiated and polymerized, and thus cured, using ultraviolet (U.V.) light. The use of U.V.-cured soldermask is advantageous in that its curing is rapid, but the thickness of such soldermask films must be uniform for successful curing. The U.V. irradiation used cannot penetrate to the bottom of deep soldermask deposits, and attempts to increase the intensity or the duration of irradiation to cure thick sections can result in the embrittlement of the thinner mask film regions.

SUMMARY OF THE INVENTION

It is an object of the present invention to provide compositions and methods for the safe and effective removal of rosin soldering fluxes from printed wiring boards without otherwise adversely affecting the boards. It is a further objective of this invention to provide safe and effective compositions and method for the removal of adhesive tape residues from printed wiring boards. It is a still further objective of the present invention to provide methods and compositions to detect improperly cured U.V. soldermask and to thus avoid printed wiring board failure on that account.

This invention provides cleaning methods and compositions for the removal of rosin solder fluxes and adhesive tape residues during the fabrication of printed circuit or wiring boards. As a result, the possibility of premature circuit failure that might occur in the absence of such cleaning is eliminated or greatly reduced. The cleaning efficacy of the compositions of the invention is such that printed wiring boards thus treated meet stringent U.S. Department of Defense specifications.

The compositions of the invention can also be used to detect improperly cured U.V. soldermask. This task is accomplished by exploiting an ability of the compositions to selectively lift inadequately cured regions of such soldermask from the board, while leaving properly cured regions intact.

The compositions of the invention are characterized by low toxity, biodegradability of non-corrosiveness, unlike the chlorinated hydrocarbon solvents and alkaline cleaners that have heretofore been employed for printed wiring board and printed circuit board cleaning. As a result, the need for costly containment equipment is eliminated.

More particularly, the present invention provides printed circuit/wiring board treatment compositions comprising terpene compounds such as limonene or dipentene. These terpene compounds, which have the ability to dissolve or complex with and remove rosin solder fluxes, oils, waxes and greasy substances or adhesive tape residues, could be used as such and removed, e.g., with clean absorbent materials. Preferably, however, the terpene compounds of the invention are combined with terpene emulsifying surfactants to facilitate removal by water.

DETAILED DESCRIPTION OF THE INVENTION

The compositions of the present invention contain terpene compounds that have the capability to dissolve rosin soldering flux or adhesive tape residues that are commonly used in the fabrication of printed circuit or wiring boards. Terpene compounds that are suitable for this purpose include but are not limited to pinene, both alpha and beta isomers, gamma terpinene, delta-3-carene, limonene and dipentene (the racemic mixture of the isomers of optically active limonene), with limonene and dipentene being preferred.

These terpene compounds could be used alone and removed, after allowing them to complex with and dissolve rosin flux or adhesive tape residues, e.g., by flushing with excess terpenes or by absorption into paper or cloth. Because they are almost completely insoluble in water, however, the terpenes cannot be directly flushed away by water. Alternatively and preferably, the terpene compounds are combined with one or more terpene emulsifying surfactants. The addition of such surfactants facilitates removal of the terpenes from printed wiring boards by rinsing with water, whereby the terpenes are formed into oil-in-water emulsions.

Numerous surfactants capable of emulsifying the terpenes of the invention may be used, including but not limited to the linear alkyl benzene sulfonates, linear or branched chain alcoholic ethoxylates and ethoxysulfates, polysorbate esters, ethoxylated alkylphenols and alkyl and dialkyl succinate compounds. An example of the latter class of compounds is sodium dioctyl sulfosuccinate. The ethoxylated alkylphenols contain various alkyl side chains and various numbers of linked ethylene oxide units. Useful compounds of this class contain from about 5 to about 20 ethylene oxide groups, with 7 or 8 being preferred.

The quantity of terpene emulsifying surfactants in the compositions of the present invention may range on a weight basis from 0 to about 40%, with the terpene compounds accounting for the balance of the compositions. In a preferred embodiment designated EC-1, the composition comprises by weight about 6.5% poly (7) ethoxy nonylphenol, 2.1% poly (10) ethoxy nonylphenol, 1.4% sodium dioctyl sulfosuccinate and 90% limonene.

The compositions of this invention are characterized by low toxicity and environmental biodegradibility, unlike the chlorinated hydrocarbon solvents that had been used prior to this invention for printed wiring board cleaning. Limonene, for example, is a natural product in various ethereal oils such as oils of lemon, orange, caraway, dill and bergamot which possesses a pleasant, lemon-like odor. EC-1 has biological oxygen demand and chemical oxygen demand values of 295 and 1,425 milligrams per liter, respectively, at a dilution of 1,000:1, as determined by methods described in Standard Methods for the Examination of Water and Wastewater, 16th Edition, American Public Health Association.

The applicability of the compositions of the invention to various aspects of the printed circuit/wiring board fabrication process can best be understood by reference to a representative process flow chart, which is shown in FIG. 1.

The assembly manufacturing process involves the placement of components such as integrated circuits, resistors, capacitors, diodes, etc. on the surface of the board or their insertion through pre-drilled holes. The components are then secured by soldering by mechanical or automatic means. Interspersed with the soldering operations are cleaning procedures and inspections to ensure that tape and solder flux residues that could lead to premature circuit failure do not remain. Points in the fabrication process to which the compositions of the invention apply will be identified below.

ROSIN FLUX CLEANING AND ADHESIVE TAPE RESIDUE REMOVAL

For the removal of rosin soldering flux deposits or adhesive tape residues during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger continuous belt cleaning machinery such as Total Systems Concept's Dual Process Cleaning System models 31-218, 31-418, 31-224 and 31-424 (Total Systems Concept, St. Louis, MO). Depending upon their design, these washers may apply the compositions of the invention by spraying with mechanical nozzles or by rolling contact with wetted roller surfaces. The temperature at which the compositions may be applied can range from room, or ambient, temperature (about 70° F.) to about 150° F. The compositions containing terpene emulsifying surfactants may be used full strength or diluted with water to as low as about a 2 volume percent concentration. The compositions should contact the boards for about 1 to about 5 minutes.

Once solder flux has been loosened and solubilized during a period of contact which typically ranges from about 1 to about 5 minutes, the compositions of the invention are removed. Where the terpene compounds are used alone, their removal can be carried out by flushing with a non-toxic, miscible solvent or by absorption into appropriate materials. In the preferred embodiments of the invention, which contain terpene emulsifying surfactants, the boards may simply be flushed with water for a period of up to about 2 minutes. Deionized water is preferred. The optimal rinsing time varies according to the kinds of surfactants and the concentrations of the terpene formulations used and can easily be determined by routine experimentation.

The cleaned boards are then dried, preferably with forced air. Drying is expedited if the air is warmed, preferably to above about 100° F.

The efficacy of rosin soldering flux removal from printed wiring boards is such that the boards meet stringent military specifications for low resistivity after cleaning. For example, the boards meet the Mil-P-28809A standard for low resistivity of solvent extracts by which contamination has been removed from a cleaned board according to Mil-P-55110C. The resistivity of solvent extracts of cleaned boards is most easily determined with an Omega Meter. Omega Meter is the registered trademark of Kenco Industries, Inc., Atlanta, GA, for a microprocessor-controlled contamination test system that rapidly measures changes in resistivity due to contaminating ions.

The result of Omega Meter measurements are expressed in equivalent units of mg NaCl/in$^2$ or its metric equivalent. According to MIL-P-28809A, the acceptable resistivity value for a cleaned board is equivalent to 2.2 ug NaCl/cm$^2$ or 14 ug NaCl/in$^2$, but far better results are routinely obtained after solder flux has been removed with the compositions of the present invention. A value of about 0.67 ug NaCl/cm$^2$ or 4.3 ug NaCl/in$^2$ is typical.

During the process of gold plating connecting tabs to improve corrosion resistance, tin-lead residues must first be removed from the unplated tabs. Removal of these residues is carried out through the use of etching chemicals that can damage other unprotected printed circuit/wiring board components. To protect vulnerable components from the etching chemicals, boards are wrapped on both sides with an adhesive plating tape which forms a shield or splash guard for all but the exposed tab area. The etching chemicals then remove the tin-lead residues on the tabs, a nickel plate is applied as a base for the gold, and gold plating of the tabs is finally carried out. The adhesive plating tape which was maintained in place through all of these etching and plating steps, is then removed; and it is at this point that the terpene compositions of the invention may most advantageously be used.

Following removal of the tape, a silicone-based and-/or rubber-based residue may remain on the board. This residue may easily be removed by the compositions of the invention under the same conditions described above for solder flux removal. The exact operational parameters will be determined by the nature of the tape residue and the tenacity with which it adheres to the board, but the conditions described above are generally effective. As in the case of solder flux removal, treatment of the board with the terpene compounds of the invention is generally followed by water flushing and air drying.

The efficiency of removal of adhesive tape residues from printed circuit/wiring boards by the compositions of the invention is such that no residues are visible after cleaning. A simple 5–10X stereomicroscope can facilitate visual inspection for tape residues following cleaning.

QUALITY CONTROL TESTING FOR IMPROPERLY CURED U.V. SOLDERMASK

It has unexpectedly been found that the compositions of the invention will cause a lifting or bubbling of uncured areas U.V. curable soldermask on printed circuit/wiring boards, while leaving properly cured regions undisturbed. The detection of improperly cured soldermask in this fashion can be beneficial by eliminating the use of such defective boards before valuable components are placed thereon. Such detection is carried out after the board is completed and ready for assembly.

Soldermask to which such detection is applicable is based upon methacrylate polymer chemistry. Such polymers, upon exposure to ultraviolet light, become "cured" through the photoinitiated cross-linking of the polymers to produce a tough protective coating that resists subsequent solder adherence. It is poorly cross-linked regions of the soldermask that are susceptible to disruption by the terpene compounds of the invention.

The detection of such uncured soldermask regions can be carried out by suspending printed circuit/wiring boards to which a U.V. soldermask has been affixed and cured in a composition such as EC-1 for a period of time, rinsing in water and then making a visual inspection. Submersion in the cleaning solution or spray application etc. for from about 1 to about 5 minutes at a temperature of from about 70° to about 150° F. is usually sufficient. The boards are then generally flushed with water and dried as described above for solder flux and adhesive tape residue removal. Where dip tanks are used, a second tank that is continually flushed with fresh water is preferably used to rinse the boards.

Inspection can be facilitated by the use of a microscope such as a 5–10X stereomicroscope, but the use of such an instrument is not essential. Boards having improperly cured U.V. solder mask show evidence of blisters, bubbles, discoloration, cracks and deformation in the defective regions.

EXAMPLE

Rosin Flux Cleaning

To illustrate the cleaning ability of the compositions of the invention, printed wiring boards that had been wave soldered using rosin flux conforming to MIL-F-14256 (type RMA) were cleaned in a mechanical cleaning system.

The cleaning composition, designated EC-1, contained by weight 90% d-limonene, 6.5% poly (7) ethoxy nonylphenol, 2.1% poly (10) ethoxy nonylphenol and 1.4% sodium dioctyl sulfosuccinate. Concentrations of 25 to 100 volume percent of EC-1 diluted in water were used as indicated below. The cleaning system was a Series 400, Model TRL-HSE Aqueous Cleaning System manufactured by The John Treiber Company, Huntington Beach, CA.

The cleaning system has a conveyor driven modular design in which the operations of loading, pre-wash rinsing, washing, air knife drying, first rinsing, air knife drying, final rinsing and high speed drying are carried out in succession. Rinse water at ambient temperature and EC-1 for washing at 120° F. were applied through spray nozzle manifolds as the boards traversed the system at a conveyor speed of 8 feet/minute. In air knife drying, turbine propelled air shears fluids from the board surfaces. In the final high speed drying module, two sets of dual air knives above and below the conveyor thoroughly dry the cleaned boards. The air in this module was heated to 120° F.

Cleaned and dried boards were evaluated for cleaning efficiency by Omega Meter resistivity measurements. To make these measurements, cleaned and dried boards were loaded into a test cell of the instrument and then extracted with a circulating solution of isopropanol: water (25:75, v/v) as specified by MIL-P-55110C and MIL-P-28809A. The resistivity of the solution was measured at a rate of 24 times per minute over a period of about 5-15 minutes until equilibrium was reached, indicating that extraction of board surface contamination was essentially complete. Equilibrium was defined as the point at which the change in measured resistivity of the solution was less than or equal to 5% of any value measured in the previous two minutes.

The equilibrium resistivity measurements for a number of cleaning tests are shown in Table 1.

TABLE 1

RESISTIVITY MEASUREMENTS OF EC-1 CLEANED ROSIN FLUX SOLDERED PRINTED WIRING BOARDS

| Test Number | EC-1 Concentration (volume %) | Equivalent NaCl Contamination (ug/in$^2$) |
|---|---|---|
| 1 | 25 | 4.7 |
| 2 | 25 | 4.1 |
| 3 | 50 | 4.1 |
| 4 | 50 | 4.7 |
| 5 | 75 | 3.9 |
| 6 | 75 | 4.0 |
| 7 | 100 | 4.6 |

As shown in Table 1, EC-1 at all concentrations examined were effective in producing levels of residual board surface contamination that were far below the MIL-P-28809A requirement of 14 ug NaCl/in$^2$ equivalent.

Many modifications and variations of this invention may be made without departing from its spirit and scope, as will become apparent to those skilled in the art. The specific embodiments described herein are offered by way of example only, and the invention is limited only by the terms of the appended claims.

What is claimed is:

1. A method for detecting improperly cured U.V. soldermask on a printed wiring board, comprising
   (a) contacting the board with a composition comprising a terpene compound and from 0 to about 40% by weight of a terpene emulsifying surfactant;
   (b) allowing the contact to continue for sufficient time to visibly loosen improperly cured U.V. soldermask areas;
   (c) removing the composition from the board; and
   (d) detecting the visibly loosened improperly cured soldermask areas.

2. The method of claim 1 wherein the terpene emulsifying surfactant is selected from the group consisting of linear alkyl benzene sulfonates, linear or branched chain alcoholic ethoxylates and ethoxysulfates, polysorbate esters, alkyl and dialkyl succinate compounds, and ethoxylated alkylphenols, which ethoxylated alkylphenols have from about 5 to about 20 ethylene oxide groups.

3. The method of claim 1 wherein the terpene compound is selected from the group consisting of the d-form of limonene, the 1-form of limonene, and dipentene.

4. The method of claim 2 wherein the terpene compound is selected from the group consisting of the d-form of limonene, the 1-form of limonene, and dipentene.

5. The method of claim 3 where the terpene compound is the d-form or the 1-form of limonene.

6. The method of claim 3 wherein the terpene compound is dipentene.

7. The method of claim 5 wherein the surfactant comprises by weight of the composition about 6.5% poly (7) ethoxy nonylphenol, 2.1% poly (10) ethoxy nonylphenol and 1.4% sodium dioctyl sulfosuccinate.

8. The method of claim 1 wherein the contact is carried out at a temperature of from about room temperature to about 150° F.

9. The method of claim 2 wherein the contact is carried out at a temperature of from about room temperature to about 150° F.

* * * * *

UNITED STATES PATENT AND TRADEMARK OFFICE
CERTIFICATE OF CORRECTION

PATENT NO. : 4,740,247
DATED : April 26, 1988
INVENTOR(S) : Hayes et al.

It is certified that error appears in the above-identified patent and that said Letters Patent is hereby corrected as shown below:

Column 4, lines 15 through 19, delete the paragraph as follows:

"The applicability of the compositions of the invention to various aspects of the printed circuit/wiring board fabrication process can best be understood by reference to a representative process flow chart, which is shown in FIG. 1."

Signed and Sealed this

Sixteenth Day of August, 1988

Attest:

DONALD J. QUIGG

Attesting Officer     Commissioner of Patents and Trademarks